(12) United States Patent
Lee et al.

(10) Patent No.: US 6,360,342 B1
(45) Date of Patent: Mar. 19, 2002

(54) BUILT-IN SELF TEST FOR MULTIPLE MEMORIES IN A CHIP

(75) Inventors: Kuen-Jong Lee; Jing-Yane Wu, both of Tainan; Wen-Ben Jone, Chiayi, all of (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/268,666

(22) Filed: Mar. 16, 1999

(30) Foreign Application Priority Data

Jun. 23, 1998 (CN) .......................................... 87110054

(51) Int. Cl.[7] .......................... G11C 29/00; G01R 31/28
(52) U.S. Cl. ........................ 714/718; 714/730; 714/733
(58) Field of Search ................................ 714/718–729, 714/733, 734–738, 730

(56) References Cited

U.S. PATENT DOCUMENTS 5,072,138 A * 12/1991 Slemmer et al. ............. 307/465
5,388,104 A * 2/1995 Shirotori et al. ............. 714/718

OTHER PUBLICATIONS

International Test Conference, Ternullo, Jr. et al, 1995, "Deterministic Self–Test of a High–Speed . . . ", pp. 33–44.

* cited by examiner

Primary Examiner—Emmanuel L. Moise
(74) Attorney, Agent, or Firm—Jacobson Holman, PLLC

(57) ABSTRACT

A new built-in self-test architecture for multiple memories in a chip is proposed in the present invention. In this architecture, all memories under test are tested in parallel using only one address generator. When the address generated from the address generator exceeds one memory's address space the memory is turned off by a BIST controller. Each word in each memory is tested by a scan-in/out method. That is, the D flip-flops in the input and output ports of each memory are connected in series and form two scan chains, respectively. Only one data input and one data output are required for the scan chains of each memory. The outputs of all scan chains are connected to a self checker for fault analysis in parallel. The address generator, data generator, self checker and the test controller are all built in a chip to satisfy the requirement of built-in self-testing.

10 Claims, 9 Drawing Sheets

BUILT-IN SELF TEST FOR MULTIPLE MEMORIES IN A CHIP

BACKGROUND OF THE INVENTION

1. Field of the Invention

The present invention relates to a new built-in self-testing (BIST) architecture for multiple memories with different sizes (different address width or different word _width) in a chip.

2. Description of the Prior Art

Traditionally, most of the testing methods of memories are limited to single memory or memories with the same sizes.

According to the report "Serial Interfacing for Embedded Memory Testing" by B. N. Dostie et al., in IEEE Design & Test of Computers, 1990, pp.52–63, built-in self-testing architecture can be applied in the testing of multiple memories with different sizes. The main characteristic is that the flip-flops in the input/output ports of each memory with different sizes are connected in series and form a scan chain. i.e., all memories with different sizes can be regarded as a large memory. The testing time of this method is very long. L. Ternullo et al. reported another testing method of built-in self-test (BIST) architecture for multiple memories with different sizes in "Deterministic Self-Test of A High-Speed Embedded Memory and Logic Processor Subsystem" in Proceedings of *Int. Test Conf.* PP. 33–44(1995). The main characteristic is that all memories to be tested share the same address generator, and each memory has its own data generator and output comparator. But, the extra area needed for this method is quite large.

The U.S. Pat. No. 5,388,104 patent demonstrated another testing method of built-in self-test architecture for multiple memories with different sizes. The main characteristic is that all memories to be tested share the same counter-based address generator, and each memory also has its own data generator and output comparator. The extra area needed for this method is also quite large.

SUMMARY OF THE INVENTION

The present invention is the design of a new built-in self-test (BIST) architecture for multiple memories with different sizes in a chip to resolve the above problems. All memories to be tested share the same address generator, which is implemented by a linear feedback shift register. In the portion of output comparison, the registers in the input/output port of each memory with different sizes are connected in series and form a scan chain, and then connected to the data input signal provided by the built-in self-test (BIST) controller in parallel. Therefore, the testing time of this method is shorter; and the extra area needed for this method is quite small. During the testing process, the small memory will be tested first and then turned off by the built-in self-test (BIST) controller, so the total testing power consumption will be decreased.

BRIEF DESCRIPTION OF THE DRAWINGS

Table 1: The March C- Algorithm

FIG. 3*a*: The schematic of the first set of linear feedback shift register of the address generator.

DESCRIPTION OF THE NUMBERS IN THE ILLUSTRATION

Figure 1:
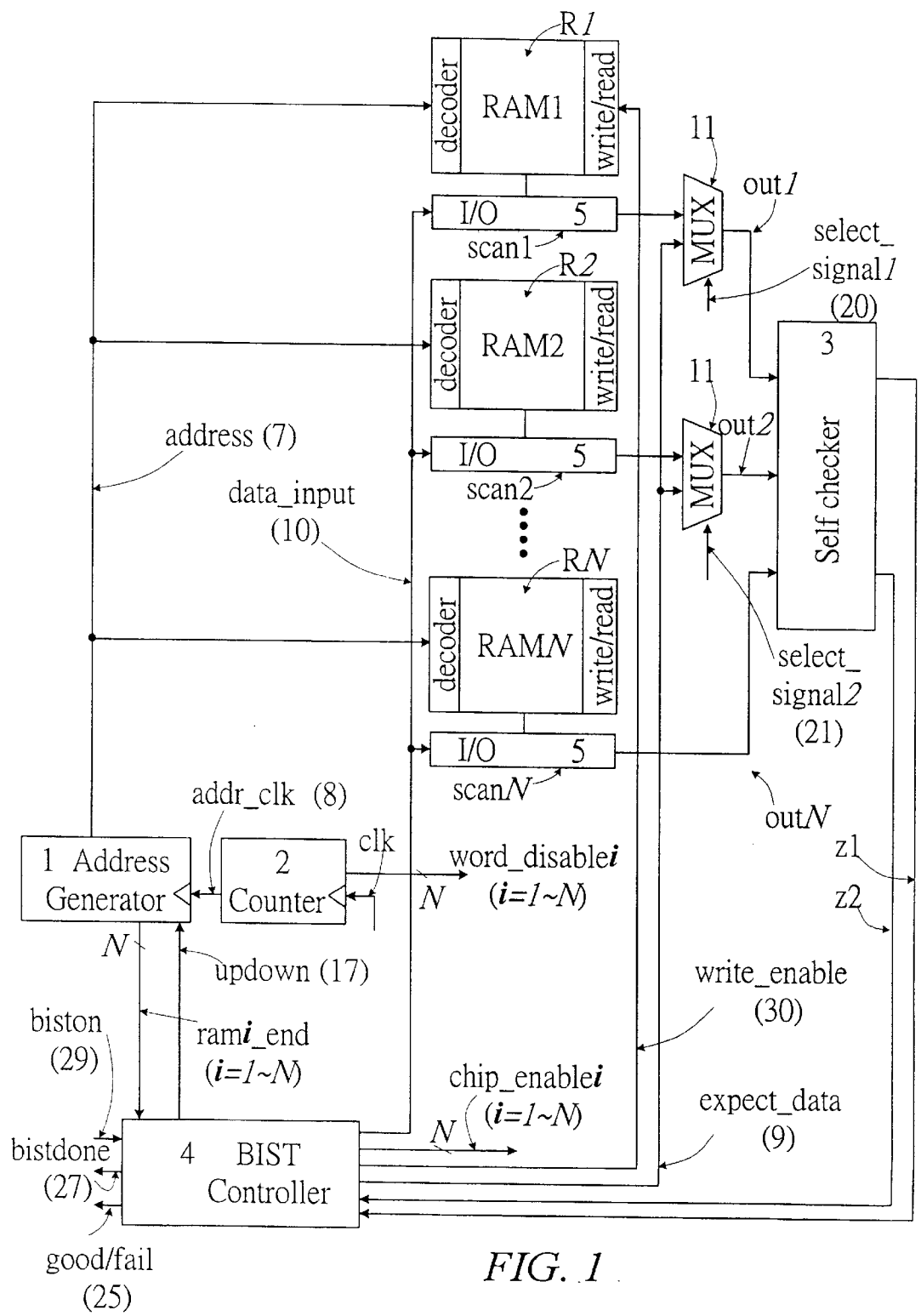
FIG. 1: The general case of the built-in self-test (BIST) architecture for multiple memories with different sizes of the present invention.

1 . . . Address Generator
2 . . . counter
3 . . . self Checker
4 . . . built-in Self-Testing (Bist) Controller
7 . . . address
5 . . . input/output Register
8 . . . addr_clk
9 . . . expected_data  6,61,62,63,64,65 . . . Flip-Flop (Dff)
10 . . . data_input
11 . . . multitplexer (MUX)
12 . . . NOR Gate
13 . . . AND Gate
14 . . . linear Feedback Shift Register (LFSR)
15 . . . First Set of Linear Feedback Shift Register (LFSR1)
16 . . . Second Set of Linear Feedback Shift Register (LFSR2)
17 . . . updown
18 . . . data RAM
19 . . . Tag RAM
20 . . . select_signal1
21 . . . select_signal2
22 . . . word_enable
23 . . . Johnson Counter
24 . . . XOR Gate
25 . . . Good/Fail
26 . . . XNOR Gate
27 . . . bistdone
28 . . . OR Gate
29 . . . biston
30 . . . write_enable
s1, s2, sn . . . Scan Chain
R1, R2, R3, Rn . . . memory
L3 . . . Word_width
r1 . . . Output Signal r1
ri . . . Output Signal ri
r2 . . . Output Signal r2

DESCRIPTION OF THE PREFERRED EMBODIMENTS

FIG. 1 shows the structure of a built-in self-testing (BIST) architecture for multiple memories with different sizes in a chip. Multiple memories with different sizes means the address_width or word_width of each memory may be different. The built-in self-testing (BIST) circuit of the present invention includes:

(1) Address Generator, 1—is formed of D flip-flops, and the number of flip-flops is determined by the number of the addresses (7) of the largest memory to be tested. The address lines of each smaller memory are connected to the least significant bits of the address generator based on the number of its address lines.

(2) Counter, 2—formed of D flip-flops, the number of flip-flops is determined by the number of bits of the largest word size among all memories, and the output of the counter is connected to the address generator (1).

When the counter counts to its maximum value, the output signal addr_clk(8) will drive the address generator, so the address generator will generate the next address.

(3) Self checker, 3—its input is connected to the output of the chained path of the input/output register (I/O,5) of each memory through multiplexer (MUX,11), or connected to expected_data (9) generated by the self-testing controller (4).

(4) Built-in self-testing controller (BIST Controller, (4)—its inputs and outputs are connected to the address generator (1), each memory and the self-checker(3), to control the overall testing process.

(5) N memories to be tested (RAM1, RAM2, . . . RAMn) and their output registers (I/0,5).

Figure 2:
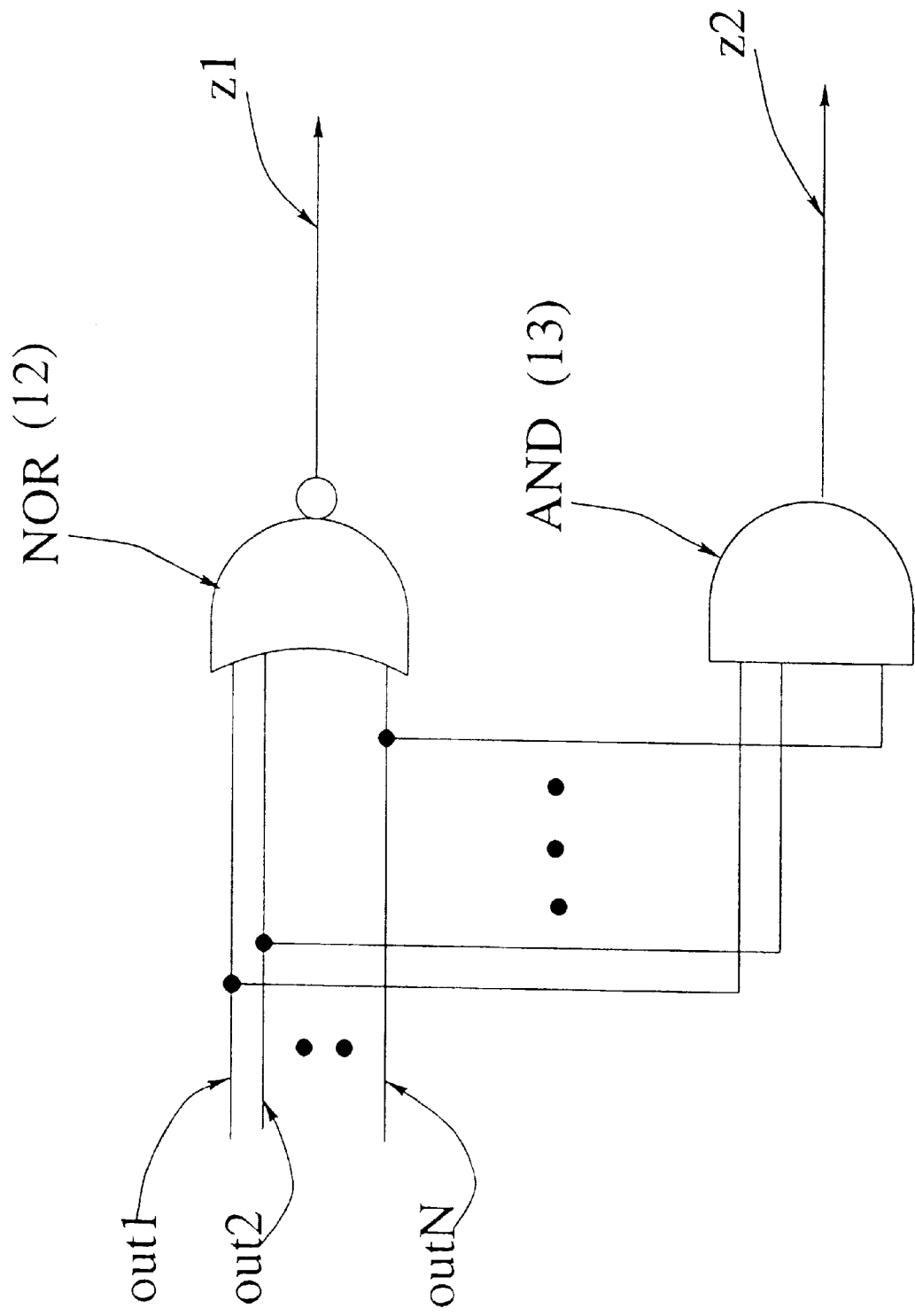
FIG. 2: The structure of the self checker to be used for multiple memories with different sizes.

During the test, the shift registers at the input/output of each memory are connected in series and form a scan chain, the inputs of all scan chains scan1(s1), scan2 (s2) scanN (sn) are connected to the data input signal (data_input, 10) controlled by the built-in self-testing controller(BIST CONTROLLER, 4) in parallel. Therefore it is possible to supply the testing data required by each memory by scan-in method. Also, the outputs of scan chains scan1 (s1), scan2 (s2), scan N (sn) are connected to the self checker(3) in parallel through multitplexer(MUX,11) for fault analysis. FIG. 2 shows the general case of the self checker (3). In the this structure, the self checker is formed of a NOR gate (12) and an AND gate(13) If there is no fault in the memory to be tested, the output of the self checker will be (0,1) or (1,0). If there exists some fault, the output of the self checker will be (0,0) or (1,1) unless all input signals connected to the self checker are wrong.

Figure 3:
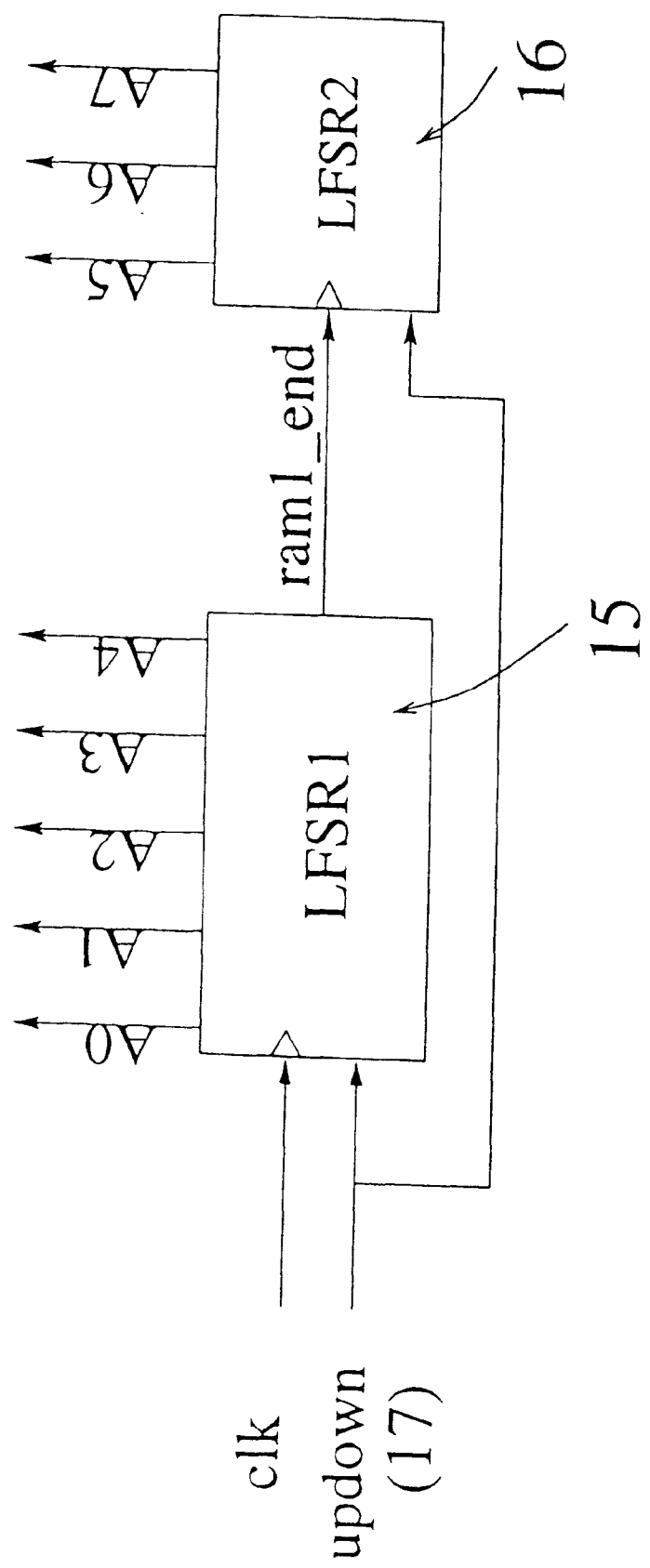
FIG. 3: The structure of the address generator
Figure 3:
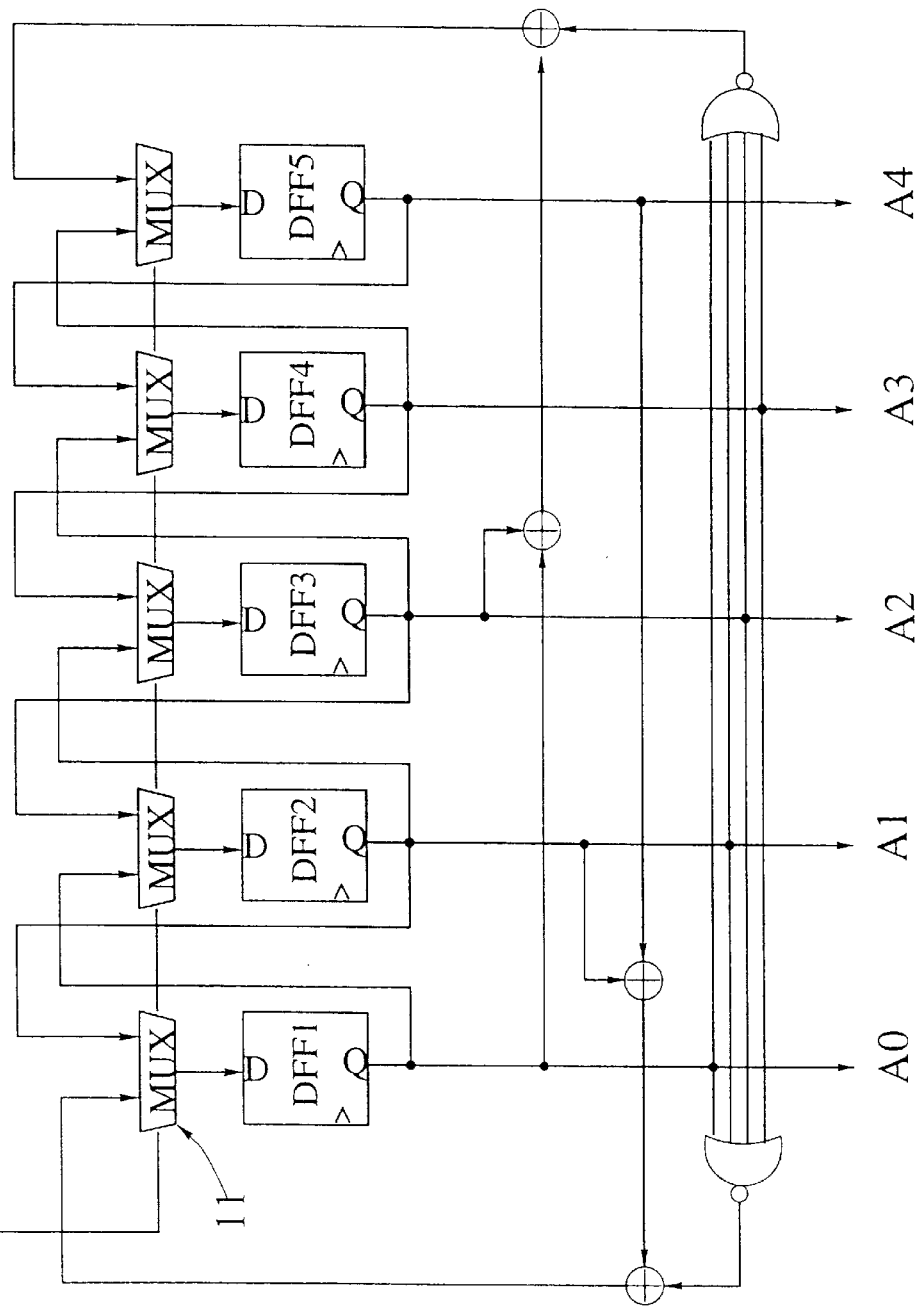
Figure 4:
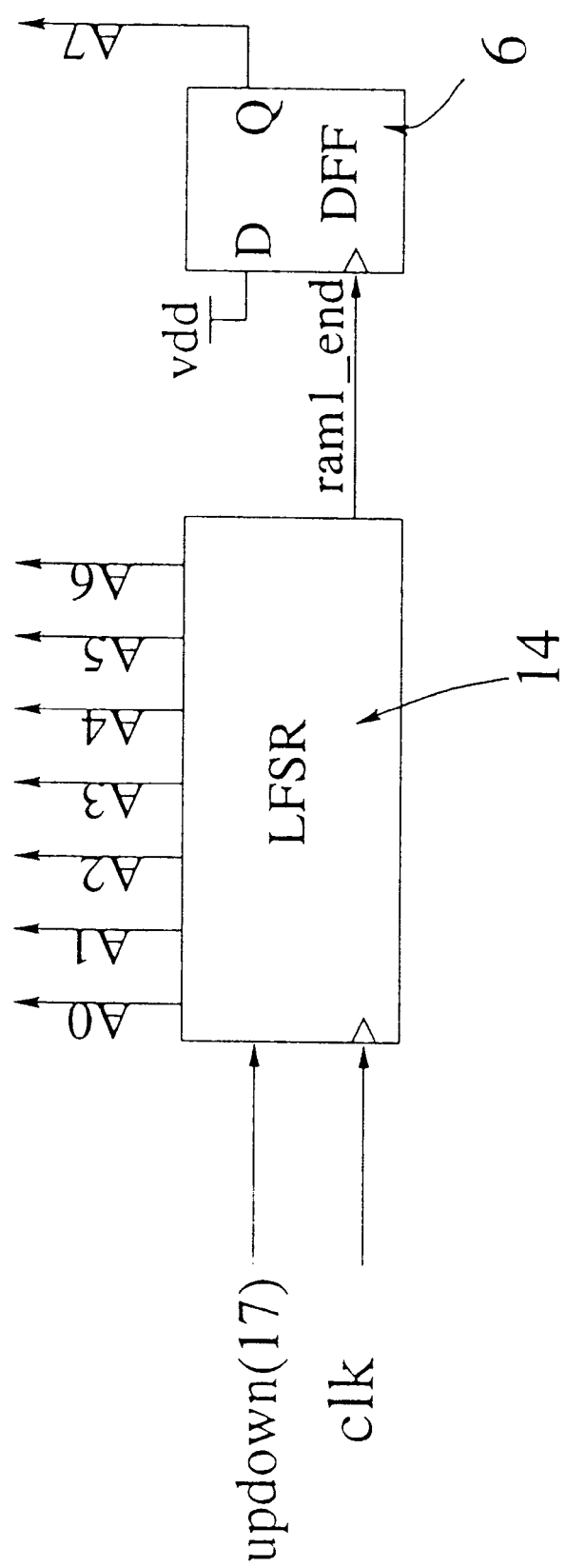
FIG. 4: Another structure of the address generator.

All memories to be tested share the same address generator (1), the address is formed of D flip-flops (DFF, 6), the number of which is the number of addresses (7) of the largest memory to be tested, and the flip-flops (DFF, 6) can be configuration into two kinds of different structures of address generators. The first kind of address generator is formed of multiple linear feedback shift registers (LFSR) connected in series. FIG. 3 shows the example of connection formed by two linear feedback shift registers. The second kind of address generator is formed of linear feedback shift registers (LFSR,14) and one or two flip-flops (DFF,6) all of which are connected in series. FIG. 4 shows the example of the connection formed by one 7-bits linear feedback shift register (LFSR) and one 1-bit flip-flop (DFF,6).

For the structure of the first address generator, it is connected by several linear feedback shift registers (LFSR, 14) in series to generate the address signals required by various memory. The number of linear feedback shift registers (14) is determined by the number of addresses of the memory to be tested. i.e., if there are N memories with different sizes and the address is arranged in the increasing order of RAM1 (R1), RAM2 (R2), RAM3 (R3), . . . , RAMN (Rn), the number of the relative addresses are k1, k2, k3, k_., kn. Therefore, the first set of linear feedback shift register (15) of the address generator is used to generate the address k1, the second set of linear feedback shift register (16) is used to generate the address (k2–k1), the third set of linear feedback shift register is used to generate the address (k3–k2), and so on. When the data of the first set of linear feedback shift register completes a cycle, the output signal ram1_end (r1) will be logic "1", and it will drive the second set of linear feedback shift register (16) to generate a new data. When the data of the second set of linear feedback shift register completes a cycle, the output signal ram2_end (r2) will be logic "1", and it will drive the third set of linear feedback shift register to generate a new data, and so on. All ram 1_end (r1), ram 2_end (r2), . . . and ram N_end (rn) will be connected to the built-in self-testing controller (4). If ki–k (i–1) equals 1 or 2, the second structure of address generator will be used to connect one or two D flip-flops(6) directly in series without connecting linear feedback shift register in series.

Figure 3B:
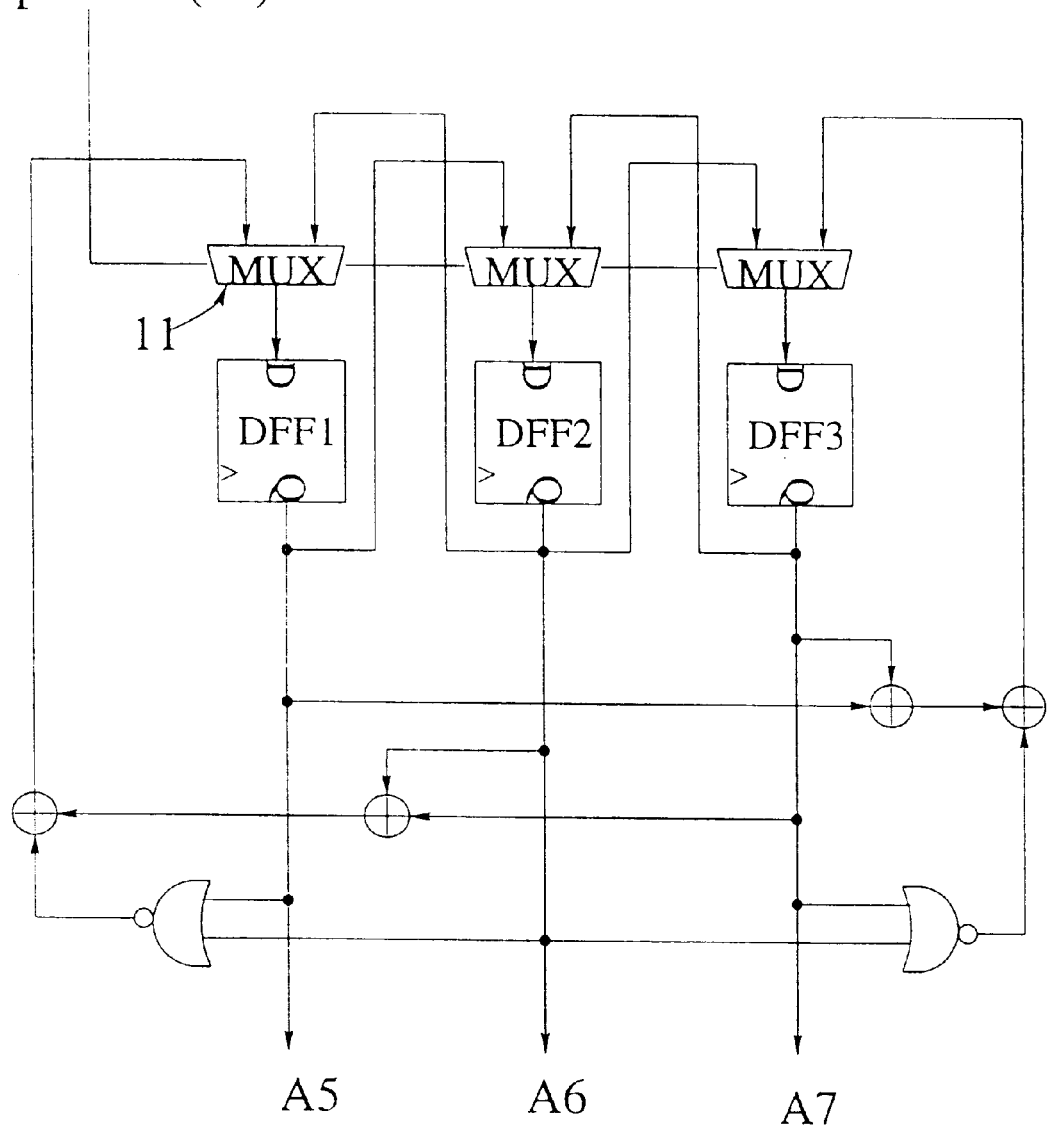
FIG. 3*b*: The schematic of the second set of linear feedback shift register of the address generator.

FIG. 3 shows the example of the connection of one address generator with two sets of linear feedback shift registers in series to generate address signal A0~A7. The first set of linear feedback shift register (LFSR2,16) generates address signal A5~A7. The schematic of the first set of linear feedback shift register (15) is shown in FIG. 3a. The characteristic polynomial of forwarding data $x^5+x^2+1$ and the characteristic polynomial of backwarding data $x^5+x^3+1$ is on the same linear feedback shift generator. The characteristic polynomial of forwarding data will generate forwarding address data, the characteristic polynomial of backwarding data will generate backwarding address data, and the multiplexer (MUX) in the input port of every flip-flop is controlled by the updown signal (17) from the built-in self-testing controller. The schematic of the second set of linear feedback shift register (16) is as shown in FIG. 3b. FIG. 4 shows the example of the connection of one address generator with the linear feedback shift register (LFSR) and flip-flop (DFF, 6) in series to generate address signal A0~A7. The linear feedback shift register (LFSR) generates A0~A6 and the flip-flop will generate A7.

Figure 5:
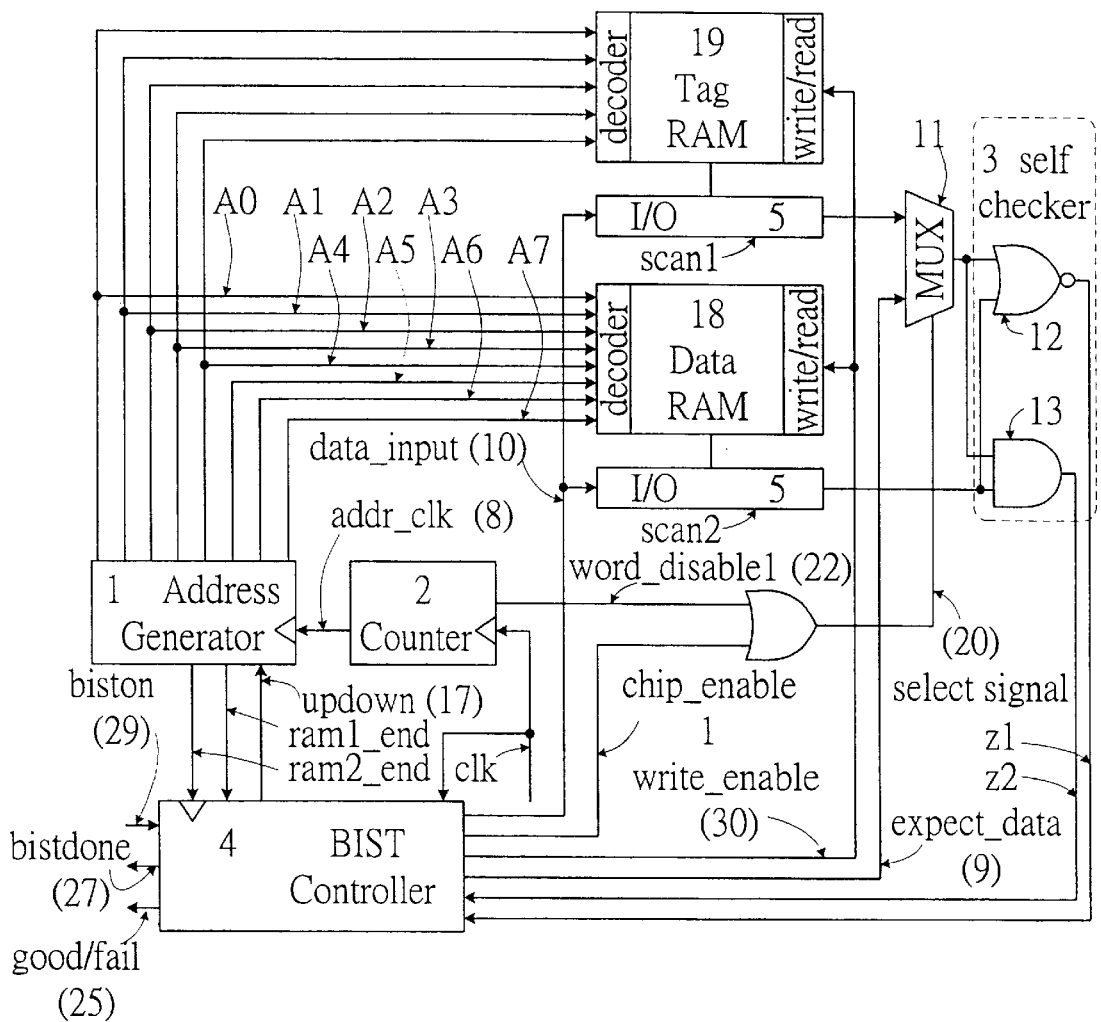
FIG. 5: The detailed schematic of the built-in self-tester.

The connection of an address generator and the memory to be tested is described as follows. Since the number of addresses of memory RAM 1 (R1) is k1, so the output of the first set of linear feedback shift register will be connected to the address input of memory RAM 1. The number of addresses of memory RAM2 (R2) is k2, therefore the outputs of bath the first set of linear feedback shift register (15) and the second set of linear feedback shift register (16) are connected to the address input of RAM2, and so on. FIG. 5 is the example of this structure applied to two memories with different sizes. The data RAM (18) has 256 words, the word width is 16, and the tag RAM (19) has 32 words, the word-width is 8. The address generator generates addresses A0~A7, of which the address signals A0~A4 are connected to the tag RAM, and A0~A7 are connected to the data RAM.

The input/output register of each memory is connected in series to form one scan chain. The input of testing data needs only one signal line, which is connected in parallel to all the inputs of the serial chains of all memories. During the reading process the output of the scan chain of each memory will be connected to the self-checker at the same time. If there is no fault in the memory to be tested, the output of the self checker will be (0,1) or (1,0). If there is fault, the output of the self checker will be (0,0) or (1,1) unless all input signals connected to the self checker are wrong. Since if the fault occurs on the address line, e.g., in A0~A4 in FIG. 5, then all memories will have faults. The following design can resolve this problem.

For the built-in self-testing controller in this structure, the output data of the memory will be replaced by expected_data (9) in two cases. For the first case, if the first set of the linear feedback shift register (15) of the address generator has already completed a cycle, i.e., if the signal ram1_end is logic "1", then the switching signal select_signal 1(20) will be logic "1", so the data connected to the self checker will be replaced by expected_data of the self-testing controller by the switching of multiplexer (MUX). After the second set of the linear feedback shift register has already completed a cycle, i.e., if the signal ram2_end is logic "1", then the switching signal select_signal 2(21) will be logic "1", so the data connected to the self checker will be replaced by expected_data (9) of the built-in self-testing controller by the switching of multiplexer (MUX), and soon. For the second case, since the word width of the memory to be tested may not be the same, so when the range of the counter has exceeded the number of bits of the memory, the word_enable (22) signal will switch the MUX to expected_data (9). By the above design, the fault of the address lines can be detected when the outputs of some memories are replaced by the expected_data(9).

Figure 6:
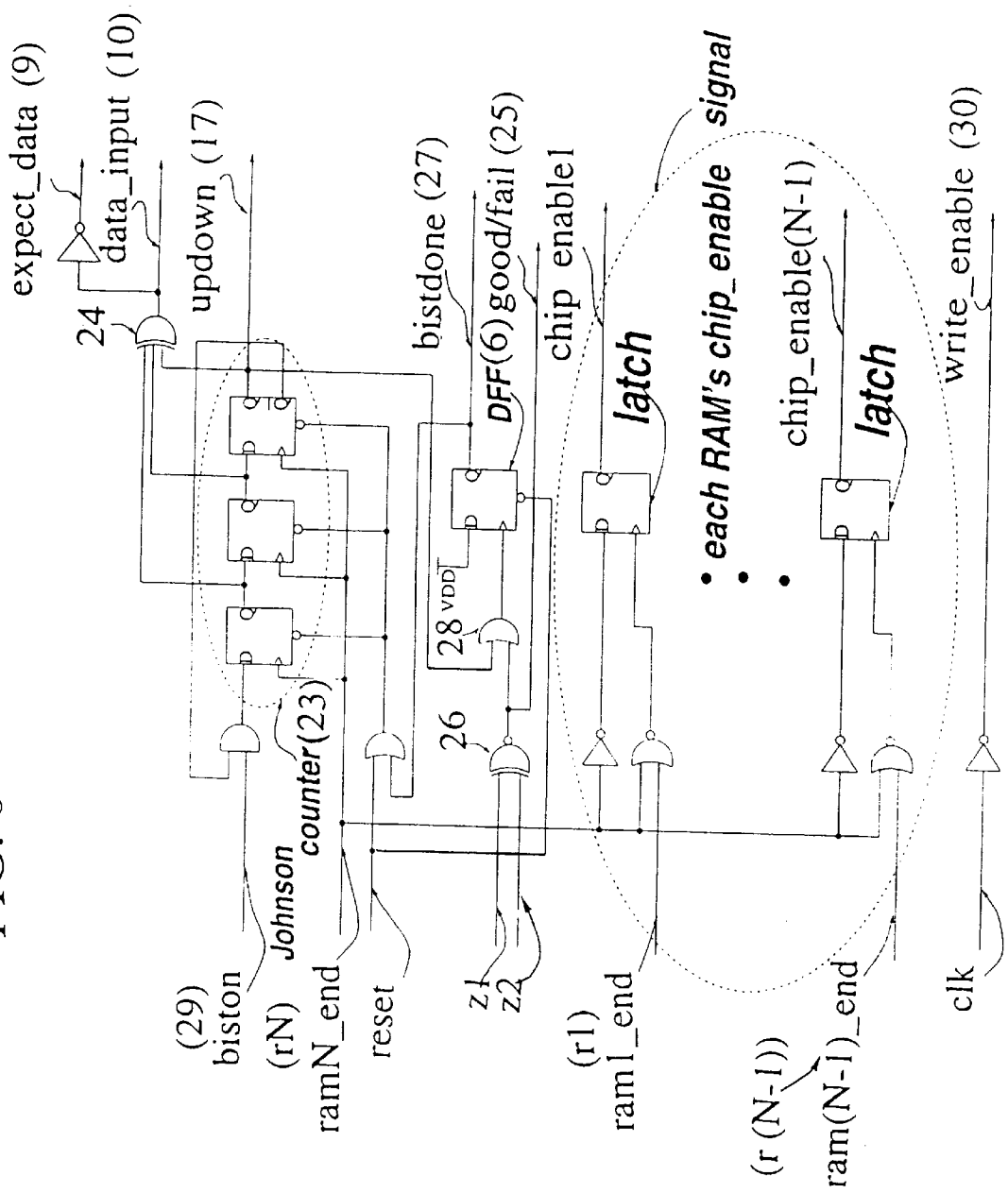
FIG. 6: The general case of the built-in self-test (BIST) controller.

The overall circuit is controlled by the built-in self-testing controller. The controller is formed of a Johnson counter (23) and some combinational logic circuit to perform the testing algorithm of memory (the March C-Algorithm). Refer to Table 1. The symbol "⇑" means the sequence of the address of the memory counts up, and the symbol "⇓" means the sequence of the address of the memory counts down. Each pair of parentheses "("and")" forms a March element. Symbol "(w0)" means a March element to write data 0 to one of the memory cells. Symbol "(r0, w1)" means a March element to read data 0 from one of the memory cells before writing data 1. FIG. 6 shows the general case in which the Johnson counter (23) is used to generate all control signals of the March C- algorithm for the memory, including updown signal (17), data_input and expected_data (9). As shown in Table 1, March C- has March 6 elements and the sequence of counting up and down is counting up, counting up, counting up, counting down, counting down, counting down respectively. Therefore a Johnson counter with 3 DFFs are used and the output of the third DFF provides the updown signal. The required writing data of the March 6 elements of March C-algorithm are 0, 1, 0, 1, 0, 1 respectively. Therefore the output of the Johnson counter is used to provide the data_input(10) via XOR gate (24).

In the testing process, if (z1,z2) equals (0,0) or (1,1), that means the memory to be tested has fault, then good/fail (25) will be logic "1" via XNOR gate(26). And bistdone(27) will be driven by good/fail(25) to be logic "1".

If (z1,z2) equals (0,1) or (1,0), that means the memory to be tested has no fault, then in every testing process of March elements, the rami_end (ri) signal which represents those signals already tested in every memory to be tested will drive Latch, so that chip_enablei is logic "1". The output data of the memory will be replaced by expected_data (9) of the built-in self-testing controller due to the switching of multiplexer (MUX). After one March element is executed, the ramN_end (rN) will drive Johnson counter (23) to generate new data to execute the testing of the next March element. When the overall testing is done, updown (17) will drive DFF via OR logic (28) so that bistdone is logic "1".

Figure 7:
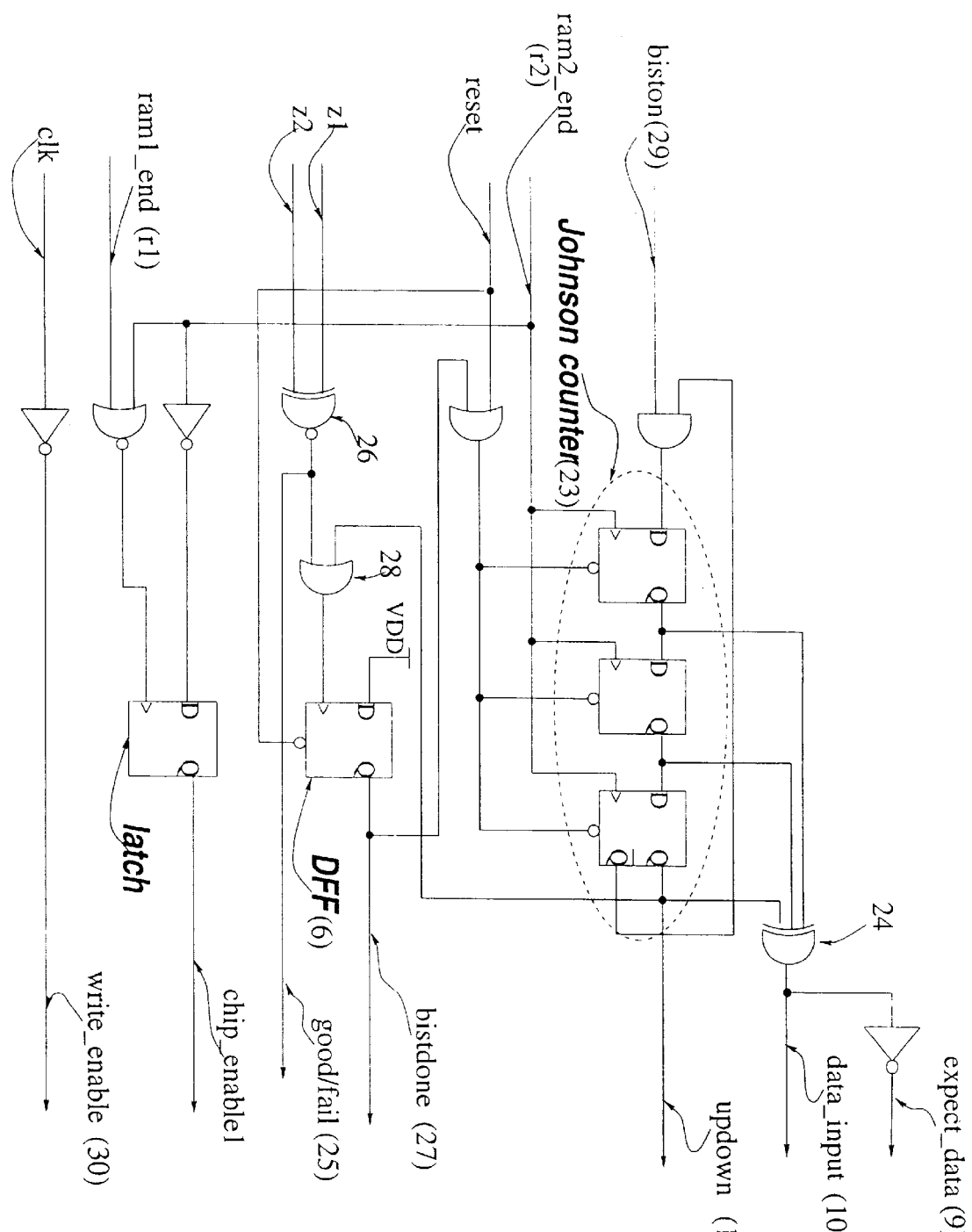
FIG. 7: The schematics of the built-in self-test (BIST) controller with two memories to be tested.

FIG. 7 depicts the example of two memories to be tested. Biston is used to select the normal or testing state. Write_enable (30) is used to control the read/write timing sequence during the testing state. If ram1_end (r1) is logic "1", that means smaller memories have been tested, then its output signal chip_enable1 will be logic "1", and the output data of memory will be replaced by expected_data (9) of the built-in self testing controller. If input signal ram2_end (r2) is logic "1", that means two testing memories have already been tested.

Updown (17) is to used to control the forwarding or backwarding data of the address generator. Data_input (10) provides the scan chain data at input/output of each memory. Expected_data (9) provides the required data for multiplexer (MUX) to switch when chip_enable of the memory is logic "1" or word_enable (30) is logic "1". Bistdone (27) will be logic "1" after the test. Good/fail (25) will be logic "0" if it is correct and logic "1" otherwise.

The built-in self-testing (BIST) circuit for multiple memories with different sizes (different address_width and different word_width) in a chip of the present invention has the following advantages: all are complete sentences (1) It requires shorter testing time.
(2) It occupies very small area.
(3) Total testing power is reduced.

TABLE 1

⇑(w0);⇑(r0, w1);⇑(r1, w0);⇓(r0, w1);⇓(r1, w0);⇓(r0)

What is claimed is:

1. A built-in self-test single chip architecture for multiple sized memories, at least one of said memories having different sized address widths and word size defined by bits, said single chip comprising:

an address generator having a plurality of D flip-flops determined by the number of addresses of the largest size of the multiple memories, said generator for testing each said address;

a counter having a plurality of D flip-flops determined by the number of bits of the largest word size of the multiple memories, said counter connected to said address generator for indicating when to generate a next address;

a self checker connected to an output of at least one of the memories for performing a fault analysis and outputting at least one signal indicating said fault analysis;

a BIST controller connected to said address generator and to at least one of the memories for controlling the testing of the memories, and said BIST controller connected to said self-checker for receiving said at least one signal indicating said fault analysis; and at least two signals from said BIST controller, said first signal indicating the testing of said at least one of said memories is finished, and said second signal indicating the results of the testing.

2. The built-in self-test single chip architecture of claim 1, wherein said memories share said address generator, and said addresses of each smaller memory are connected to a least significant output of the address generator based on the number of addresses.

3. The built-in self-test single chip architecture of claim 2, wherein said address generator comprises a serial connection of linear feedback shift registers to said memories.

4. The built-in self-test single chip architecture of claim 2, wherein said address generator comprises a connection of a linear feedback shift register and said D flip-flops in series.

5. The built-in self-test single chip architecture of claim 1, wherein said D flip-flops of said address generator are connected to said memories having shift registers as an input/output port of each said memory and said registers are connected in series to form a scan chain, all said scan chains at the input ports are connected to a data_input of the built-in self-testing controller in parallel; and for output, the scan chains at the input/output of all memories to be tested are connected to the self checker in parallel for the fault analysis.

6. The built-in self-test single chip architecture of claim 1, wherein said self checker is formed of a NOR gate and an AND gate.

7. The built-in self-test single chip architecture of claim 1, wherein output data of a memory will be replaced by an expected_data signal from the built-in self-testing controller by switching a multiplexer (MUX) if the addresses generated by the address generator exceed the address space of the memory; when the range of the counter has exceeded the number of bit words of the memory, a word_enable signal will be logic "1", the output data of the memory will be replaced by the expected_data signal of the built-in self-testing controller by the switching of the multiplexer (MUX).

8. The built-in self-test single chip architecture of claim 1, wherein said built-in self-test controller is a simple Johnson counter, which is used to generate all control signals of a testing algorithm and said algorithm is defined as a March C-algorithm.

9. The built-in self-test single chip architecture of claim 8, wherein said testing algorithm has six March elements and the sequence of address-counting is counting up, counting up, counting up, counting down, counting down, counting down respectively; and a Johnson counter with three DFFs is used and the output of the third DFF provides the updown signal.

10. The built-in self-test single chip architecture of claim 8, wherein an output of said Johnson counter is used to provide the data_input via XOR gate.

* * * * *